United States Patent
Chen et al.

[11] Patent Number: 6,134,385
[45] Date of Patent: Oct. 17, 2000

[54] WATER FREE FURNACE TUBE WITH SELF-HEATING QUARTZ PLUG

[75] Inventors: Chun-Huang Chen, Chia-I; Tien-Jui Liu, Tai-Chung, both of Taiwan

[73] Assignee: United Microelectronics Corp., Hsin-Chu, Taiwan

[21] Appl. No.: 09/309,216

[22] Filed: May 12, 1999

[51] Int. Cl.[7] .................................. H01L 21/205
[52] U.S. Cl. ................ 392/416; 219/390; 118/724; 432/250
[58] Field of Search .................. 392/416, 418; 219/405, 411, 390; 118/724, 725, 50.1, 733; 373/112, 110, 137; 432/250; 110/336, 349

[56] References Cited

U.S. PATENT DOCUMENTS

| | | | |
|---|---|---|---|
| 3,800,716 | 4/1974 | Berger | 432/250 |
| 4,020,791 | 5/1977 | Reuschel et al. | 219/390 |
| 4,312,294 | 1/1982 | Satoh | 432/250 |
| 4,796,543 | 1/1989 | Barkley | 432/250 |
| 5,259,883 | 11/1993 | Yamabe et al. | 118/725 |
| 5,584,934 | 12/1996 | Lin | 118/724 |
| 5,828,036 | 10/1998 | Hsue et al. | 219/390 |

FOREIGN PATENT DOCUMENTS

| | | | |
|---|---|---|---|
| 63-230834 | 9/1988 | Japan . | |
| 5-13337 | 1/1993 | Japan . | |
| 1213758 | 11/1970 | United Kingdom | 432/250 |

*Primary Examiner*—John A. Jeffery
*Attorney, Agent, or Firm*—Harness, Dickey & Pierce, P.L.C.

[57] ABSTRACT

A furnace tube with quartz plug is configured to have an oxidation performed therein, and at least one elongated protruding portion with an opening on one side of the tube. The furnace also includes a quartz plug with a portion thereof inserted inside the elongated protruding portion, and with another portion thereof inserted into the tube. Accordingly, water resided in a gap between inner surface of the elongated protruding portion and outer surface of the quartz plug can be evaporated by self-heating of the quartz plug.

12 Claims, 2 Drawing Sheets

WATER FREE FURNACE TUBE WITH SELF-HEATING QUARTZ PLUG

BACKGROUND OF THE INVENTION

1. Field of the Invention

The present invention relates to a furnace tube for use in a semiconductor process, and more particularly, to a furnace tube with self-heating plug to eliminate condensed water in the tube.

2. Description of the Prior Art

Silicon oxide layer growing is an essential processing step in semiconductor device fabrication, and is generally performed through a thermal oxidation process in a furnace tube. FIG. 1 shows a cross-sectional view of a conventional furnace tube 100, which generally includes a gas injector 120, a thermocouple 220, a heater 240, and an opening 180 with a hollow cap 200 inserted therein. After a wet oxidation process, some over-saturated water is usually condensed on the surface around the opening 180 and the cap 200. In a later round of using the furnace, the condensed water drop will diffuse into the main body of the tube, forming an unwanted thin wet oxide layer on the silicon water surface. According to the foregoing reasons, there is a need for a furnace tube to eliminate or prevent the aforementioned water-condensing problem.

SUMMARY OF THE INVENTION

In accordance with the present invention, a furnace tube is provided for substantially eliminating and preventing the water from being condensed therein. In one embodiment, the furnace includes a quartz tube configured to have an oxidation performed therein, and a gas injector configured to conduct gas oxygen and hydrogen into the quartz tube, the gas injector being located approximately at the center of one side of the quartz tube. Four elongated protruding portions each with an opening on said side of the tube are provided, wherein the four elongated protruding portions are located on peripheral edge of said side, and are separated from each other with equal distance. The present invention also includes three quartz plugs each with a portion thereof inserted inside one of the elongated protruding portion, and with another portion thereof inserted into the tube. Accordingly, water drop resided in a gap between inner surface of the elongated protruding portion and outer surface of the quartz plug can be evaporated by self-heating of the quartz plug. The furnace further includes a thermocouple inserted into a lower one of the four elongated protruding portions, and a heater encompassing the quartz tube to provide elevated temperature inside the quartz tube for performing the semiconductor process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
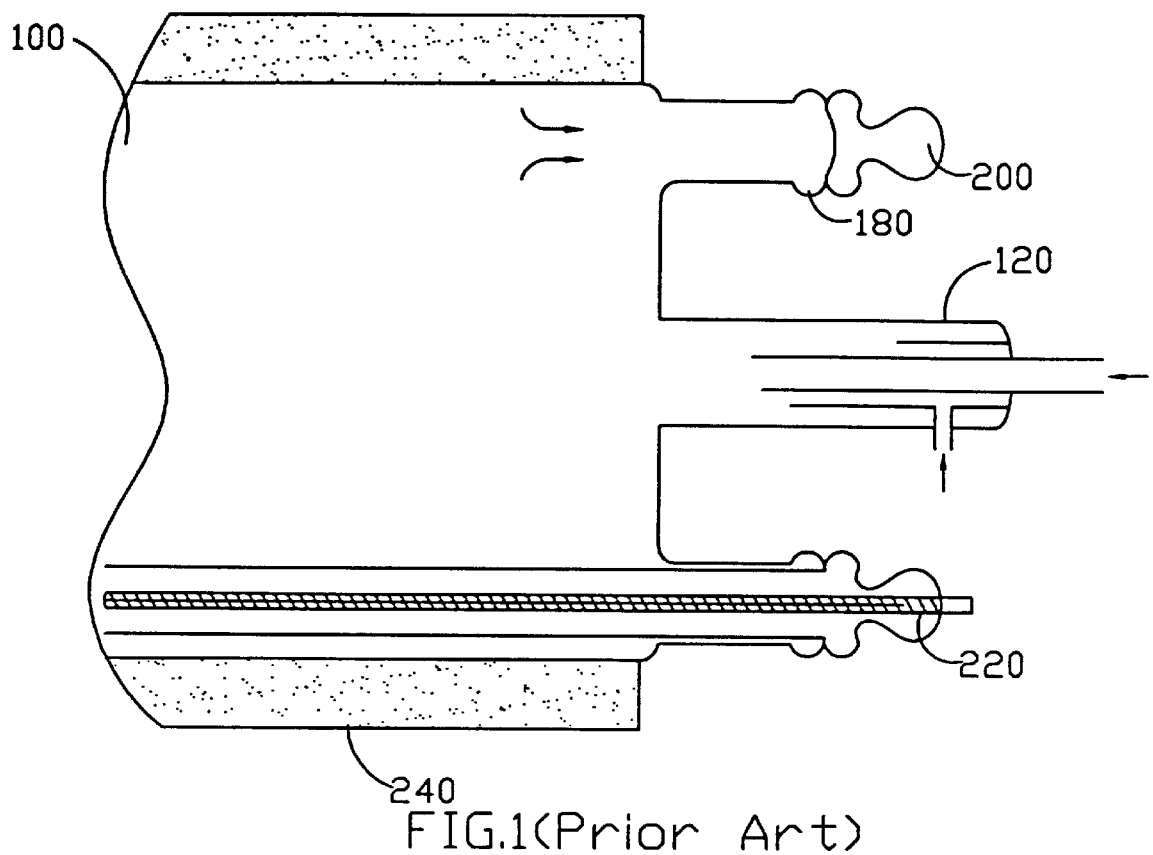
FIG. 1 shows a cross-sectional view of a conventional furnace tube.
Figure 2:
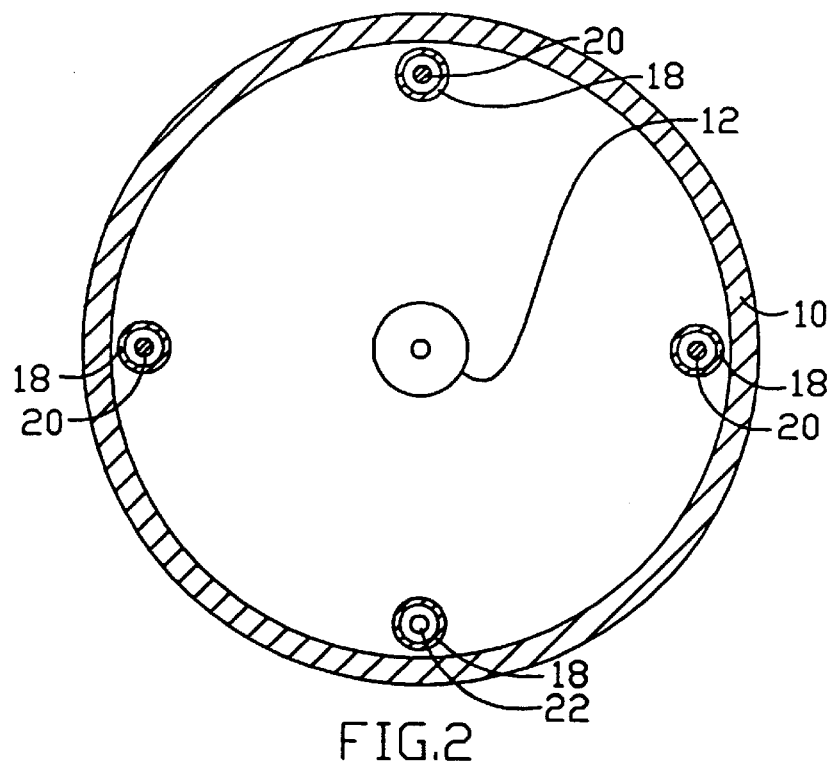
FIG. 2 shows a schematic diagram illustrative one side of a furnace tube for use in a semiconductor process according to one embodiment of the present invention.

FIG. 2 shows a schematic diagram illustrative one side of a furnace tube 10 for use in a semiconductor process such as oxidation according to one embodiment of the present invention. In this embodiment, the furnace tube 10 is made of quartz. Around the center of the furnace tube 10 is a gas injector 12, which is used to conduct reacting gas such as oxygen and hydrogen. Further, there are four elongated protruding portions 18, each with an opening, located on the peripheral edge of the furnace tube 10, wherein these four protruding portions 18 are separated from each other with equal distance. The configuration of these protruding portions 18 can be clearly seen by a cross-sectional view of the furnace tube shown in FIG. 3. The tube 10 is usually rotated by 90 degree after a lapse of operation, so that each of the elongated protruding portions 18 can resist substantially the same effect from the elevated temperature. The present invention further includes three solid quartz plugs 20 respectively inserted into the opening of the three of the protruding portions 18. For example, the top, the left and the right openings 18 receive their corresponding plug 20 as in the exemplified embodiment. The fourth opening of the protruding portion 18 is generally used for receiving a thermocouple 22, which is used for detecting the distribution of the elevated temperature inside the furnace tube 10, and is usually at the bottom area.

Figure 3:
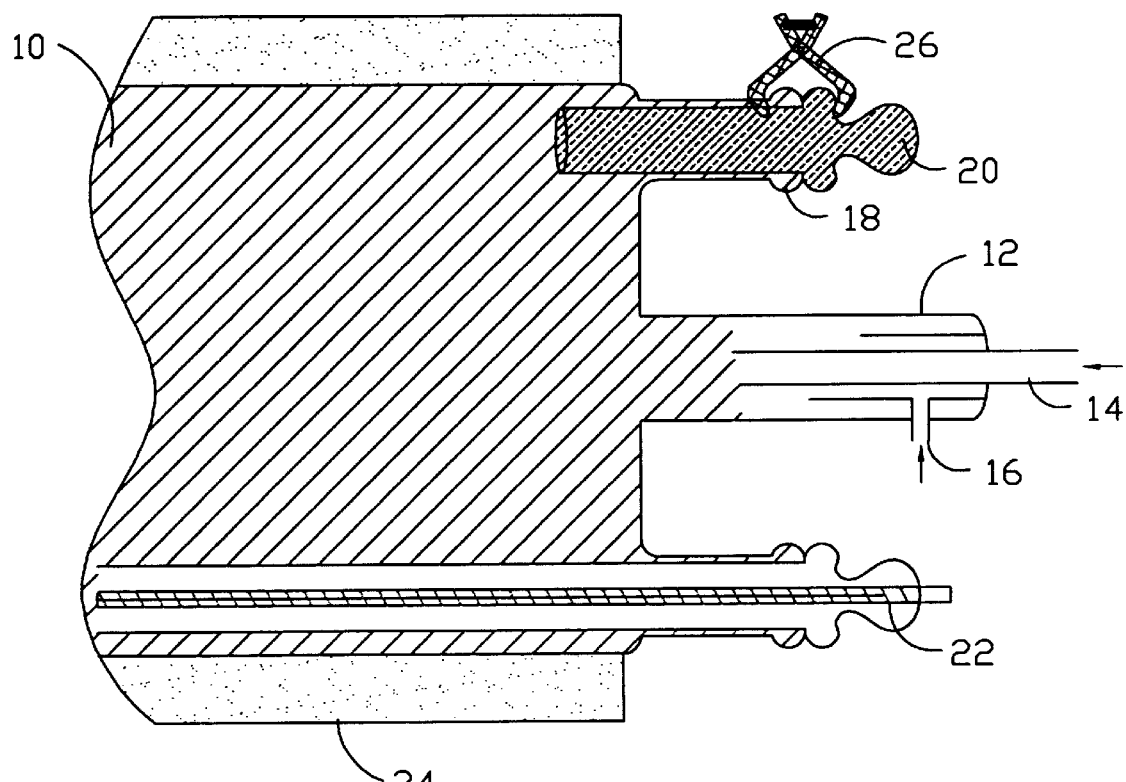
FIG. 3 shows a cross-sectional view of the furnace tube according to the embodiment of the present invention.

Referring to FIG. 3, a gas injector inlet 12 is configured to conduct reacting gas into the tube 10. The gas injector 12 is usually located at the center of the tube 10. In the embodiment, gas hydrogen 14 and gas oxygen 16 are separately conducted into the tube 10 from different inlet. More specifically, in a wet oxidation process, the oxygen is firstly introduced, followed by the hydrogen.

The quartz plug 20 mentioned above has a diameter smaller than the protruding portion 18. In this embodiment, the quartz plug 20 has a ball-shaped portion at one end situated out of the tube 10, and has a bar-shaped portion at the other end situated inside the tube 10. Furthermore, portion of the bar-shaped portion is located inside the passage of the protruding portion 18, while another portion of the bar-shaped portion is located in the main body of the tube 10. The main body used in this specification refers to the region in which the temperature is controlled at a predetermined value, and in which the reaction takes place. During the oxidation process, water resided in the space gap between the inner surface of the elongated protruding portion 18 and the outer surface of the quartz plug 20 can be accordingly evaporated by the self-heated plug 20.

The furnace tube according to the present invention further includes a metal clamp 26 for fixing the protruding portion 18 and the plug 20. Also, the present invention has a heating element 24 or a heater, encompassing the main body of the tube 10 to provide an elevated temperature inside the tube 10 for performing the oxidation process.

Although specific embodiments have been illustrated and described, it will be obvious to those skilled in the art that various modifications may be made without departing from what is intended to be limited solely by the appended claims. For example, although a wet oxidation is explained in the embodiment, it is appreciated that other oxidation such as dry oxidation can be adapted.

What is claimed is:

1. A furnace for use in a semiconductor process, comprising:

a tube configured to have oxidation performed therein;

at least one elongated protruding portion with an opening on one side of said tube; and a quartz plug with a portion thereof inserted inside said elongated protruding portion, and with another portion thereof inserted into main body of said tube, wherein water residing in a gap between inner surface of said elongated protruding portion and outer surface of said quartz plug can be evaporated by self-heating of the quartz plug.

2. The furnace according to claim 1, further comprising a gas injector configured to conduct gas, said gas injector being located on the same side of said elongated protruding portion, and being located approximately at the center of said side.

3. The furnace according to claim 1, wherein said quartz plug is solid.

4. The furnace according to claim 1, further comprising a thermocouple inserted into a lower one of said at least one elongated protruding portion.

5. The furnace according to claim 4, further comprising a heater encompassing said tube to provide elevated temperature inside the tube for performing the semiconductor process.

6. The furnace according to claim 1, wherein said tube comprises quartz.

7. The furnace according to claim 1, wherein said elongated protruding portion comprises quartz.

8. The furnace according to claim 1, further comprising conducting oxygen and hydrogen gas into the tube.

9. A furnace for use in a semiconductor process, comprising:
   a quartz tube configured to have oxidation performed therein;
   a gas injector configured to conduct oxygen and hydrogen gas into said quartz tube, said gas injector being located approximately at the center of one side of said quartz tube;
   four elongated protruding portions each with an opening on said side of the tube, said four elongated protruding portions being located on peripheral edge of said side, and are separated from each other with approximately equal distance;
   three quartz plugs each with a portion thereof inserted inside one of said elongated protruding portions, and with another portion of said plug inserted into main body of said quartz tube, wherein water resided in a gap between inner surface of said elongated protruding portion and outer surface of said quartz plug can be evaporated by self-heating of the quartz plug;
   a thermocouple inserted into a lower one of said four elongated protruding portions; and
   a heater encompassing said quartz tube to provide elevated temperature inside the quartz tube for performing the semiconductor process.

10. The furnace according to claim 9, wherein quartz plug comprises a ball-shaped end situated out of the quartz tube, and a bar-shaped portion situated inside the quartz tube.

11. The furnace according to claim 9, wherein said thermocouple is used to detect distribution of the temperature in the quartz tube.

12. A furnace for use in a semiconductor process, comprising:
    a tube configured to have oxidation performed therein;
    at least one elongated protruding portion with an opening on one side of said tube; and
    a quartz plug with a portion thereof inserted inside said elongated protruding portion, and with another portion thereof inserted into main body of said tube, wherein wafer resided in a gap between inner surface of said elongated protruding portion and outer surface of said quartz plug can be evaporated by self-heating of the quartz plug;
    a clamp for fixing said elongated protruding portion and said quartz plug.

* * * * *